(12) United States Patent
Miyata et al.

(10) Patent No.: US 11,372,399 B2
(45) Date of Patent: Jun. 28, 2022

(54) SYSTEM SECTION DATA MANAGEMENT DEVICE AND METHOD THEREOF

(71) Applicant: Hitachi, Ltd., Tokyo (JP)

(72) Inventors: Yasushi Miyata, Tokyo (JP); Yohsuke Ishii, Tokyo (JP)

(73) Assignee: HITACHI, LTD., Tokyo (JP)

( * ) Notice: Subject to any disclaimer, the term of this patent is extended or adjusted under 35 U.S.C. 154(b) by 422 days.

(21) Appl. No.: 16/412,566

(22) Filed: May 15, 2019

(65) Prior Publication Data

US 2019/0384272 A1 Dec. 19, 2019

(30) Foreign Application Priority Data

Jun. 15, 2018 (JP) .............................. JP2018-114260

(51) Int. Cl.
*G05B 23/02* (2006.01)
*G01R 31/08* (2020.01)
*G06Q 50/06* (2012.01)

(52) U.S. Cl.
CPC ....... *G05B 23/0227* (2013.01); *G01R 31/085* (2013.01); *G06Q 50/06* (2013.01)

(58) Field of Classification Search
CPC . G06K 9/6218; G05B 23/0227; G01R 31/085
See application file for complete search history.

(56) References Cited

U.S. PATENT DOCUMENTS

| 2004/0167414 A1* | 8/2004 | Tanabe ..................... A61B 5/02 600/500 |
| 2007/0263550 A1* | 11/2007 | Perng .................... H04L 43/045 370/252 |
| 2018/0210803 A1* | 7/2018 | Kobayashi .......... G06F 11/3051 |
| 2020/0361029 A1* | 11/2020 | Goya .................... B23Q 15/00 |

FOREIGN PATENT DOCUMENTS

JP 2010-218187 A 9/2010

* cited by examiner

*Primary Examiner* — Michael J Dalbo
(74) *Attorney, Agent, or Firm* — Mattingly & Malur, PC

(57) ABSTRACT

Input data, output data having a plurality of output parameters obtained by analyzing the input data, and a plurality of associations between the input data and the output data are stored. A division condition for dividing an output data distribution in which the output data is plotted for two axes corresponding to two parameters among the plurality of output parameters is extracted, the output data distribution is divided according to the division condition, and output data of the divided output data distribution is derived as first and second output data distribution rules corresponding to the two axes. First and second output data distribution region candidates are calculated by applying the first and second output data distribution rules to new input data, and an output data distribution region of the new input data is estimated by combining the first and second output data distribution region candidates with each other.

10 Claims, 17 Drawing Sheets

Outline of a processing flow of the system section data management device : Example 1

FIG. 5

Example of an input data management table : Example 1

~ 501

| INPUT DATA ID | INPUT PARAMETER 1 (PHASE AT POINT 1 [rad]) | ... | INPUT PARAMETER N (OUTPUT OF POWER GENERATOR M [MW]) | OUTPUT DATA BELONGING GROUP ID | OUTPUT DATA ESTIMATION BELONGING GROUP ID |
|---|---|---|---|---|---|
| 1 | 0.11 | ... | 12.3 | G001 | G001 |
| 2 | 0.12 | ... | 0.0 | G001 | G001 |
| 3 | 0.20 | ... | 45.1 | G002 | G002 |
| 4 | 0.16 | ... | 20.2 | - | G001 |
| 5 | 0.08 | ... | 13.4 | - | G004 |

Example of an output data management table : Example 1

| OUTPUT DATA ID | OUTPUT PARAMETER 1 (WEAK PART [PIECES]) | ... | OUTPUT PARAMETER N (NUMBER OF WEAK AREAS [PIECES]) | OUTPUT DATA BELONGING GROUP ID | INPUT DATA ID |
|---|---|---|---|---|---|
| 1 | 23 | ... | 2 | G001 | 1 |
| 2 | 21 | ... | 1 | G001 | 2 |
| 3 | 11 | ... | 7 | G002 | 3 |

Example of an output data distribution region division pattern : Example 1

FIG. 10

Example of an output data distribution region management table : Example 1

1001

| DIVISION REGION ID | DIVISION CONDITION Xr | DIVISION CONDITION Yr | DIVISION PATTERN ID | FIRST OUTPUT DATA DISTRIBUTION RULE | SECOND OUTPUT DATA DISTRIBUTION RULE |
|---|---|---|---|---|---|
| 1 | 3 | 1 | 1-1 | SVM-001 | SVM-002 |
| 1 | 6 | 2 | 1-2 | | |
| 2 | 7 | 5 | 2-1 | | |
| 2 | 5 | 3 | 2-2 | | |

Example of a system section data management device that outputs data management information : Example 2

Example of the system section data management device that outputs parameter candidates : Example 3

Flow of output data distribution rule derivation : Example 1

Example of an input data group management table : Example 1

US 11,372,399 B2

SYSTEM SECTION DATA MANAGEMENT DEVICE AND METHOD THEREOF

CROSS-REFERENCE TO RELATED APPLICATION

The present application claims priority from Japanese application JP 2018-114260, filed on Jun. 15, 2018, the contents of which is hereby incorporated by reference into this application.

BACKGROUND OF THE INVENTION

1. Field of the Invention

The present invention relates to technology used in the operation of a facility such as a power system and the planning thereof.

2. Description of Related Art

Japanese Unexamined Patent Application Publication No. 2010-218187 (hereinafter, referred to as JP-A-2010-218187) discloses technology for specifying a latent variable highly correlated with a quality index generated from quality inspection data using correlation between manufacturing factor data and the quality inspection data correlated with each other and for presenting adjustment details of a manufacturing factor in order to bring the quality inspection data close to a target. In JP-A-2010-218187, the adjustment details of the manufacturing factor are determined by predicting a value, which is to be taken by the latent variable in order to achieve any quality index, from a linear correlation by using a PLS arithmetic method in a case where a correlation with the latent variable highly correlated with the quality index is linear.

In JP-A-2010-218187, since the adjustment details of the manufacturing factor are determined by predicting a value, which is to be taken by the latent variable in order to achieve any quality index, from a linear correlation in a case where a correlation with the latent variable highly correlated with the quality index is linear, prediction of a value which is to be taken by the latent variable in a case where a correlation between the quality index and the latent variable highly correlated with the quality index is non-linear, that is, in a case where a correlation cannot be expressed by a linear function in spite of having a relation therebetween has not been taken into consideration. For this reason, there are problems with the determination of adjustment details of a manufacturing factor and the estimation of the value of a quality index from the manufacturing factor.

SUMMARY OF THE INVENTION

Consequently, the present invention is to provide a system section data management device and a method thereof which are capable of estimating a region in which a plurality of parameter values of output data are distributed from input data even when a relation between a plurality of parameters of input data corresponding to a latent variable and a plurality of parameters of output data corresponding to a quality index is non-linear in a process of processing the input data constituted by a plurality of parameter values and outputting the output data constituted by the plurality of parameter values.

According to one embodiment, preferably, a system section data management device includes a distribution rule extraction preparation unit that stores input data of system section data having a plurality of input parameters, output data having a plurality of output parameters by analyzing the input data, and a plurality of associations between the input data and the output data. In addition, the system section data management device further includes an output data distribution rule derivation unit that extracts a division condition, corresponding to at least two axes, for dividing an output data distribution in which the output data is plotted for the two axes corresponding to at least two parameters among the plurality of output parameters into a plurality of regions, divides the output data distribution according to the division condition, derives the output data of the divided output data distribution by setting input data aggregates, corresponding to output data equal to or greater than or equal to or less than division conditions respectively corresponding to the two axes, to be first and second input data groups, setting a rule belonging to the first input data group to be a first output data distribution rule, and setting a rule belonging to the second input data group to be a second output data distribution rule. Further, the system section data management device further includes an output data distribution estimation unit that estimates an output data distribution region of new input data by setting new system section data to be the new input data, calculating a first output data distribution region candidate obtained by applying the first output data distribution rule to the new input data and a second output data distribution region candidate obtained by applying the second output data distribution rule thereto, and combining the first output data distribution region candidate and the second output data distribution region candidate with each other.

According to the present invention, it is possible to narrow down a distribution region of output data from input data even when a relationship between a plurality of parameter values (input data) held by system section data and a plurality of parameter values (output data) which are results of interpretation and analysis for the system section data is non-linear.

Problems, configurations, and effects other than those described above will become apparent from the following description of an embodiment.

BRIEF DESCRIPTION OF THE DRAWINGS

FIG. 5 is a diagram illustrating an example of an input data management table;

FIG. 10 is a diagram illustrating an example of an output data distribution region management table;

DESCRIPTION OF EMBODIMENTS

Figure 1:
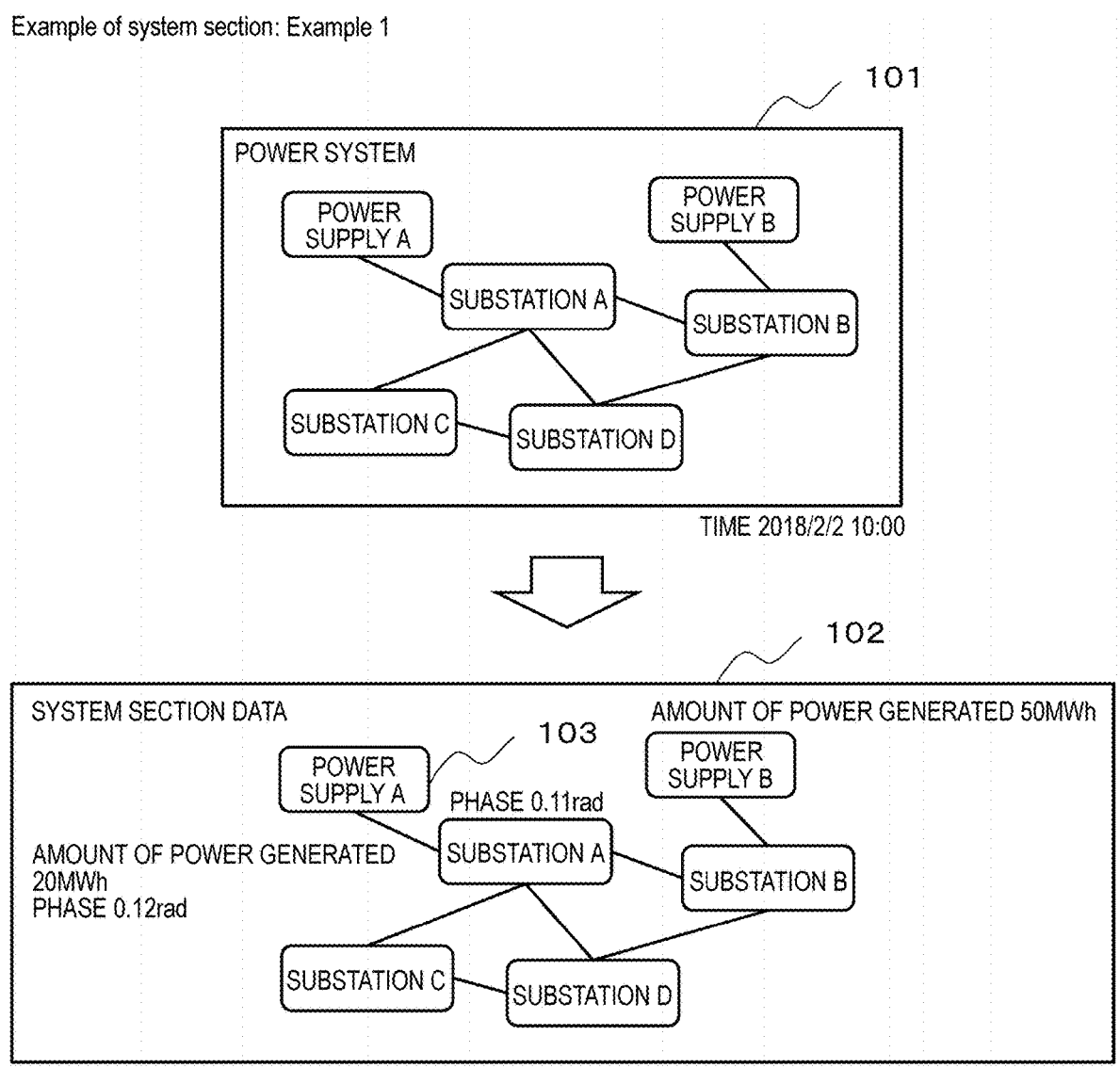
FIG. 1 is a diagram illustrating an example of system section data which is a data management target.

First, an example of a field to which the present technology is applied will be briefly described.

The present technology may be applied to technology which is used in the operation of a facility such as a power system and the planning thereof and is technology for interpreting and analyzing system section data holding a plurality of parameters indicating the state of the facility and the power system at the time of operation and planning by using the system section data as input data, estimating a region in which pieces of output data which are results of the analysis are distributed, and classifying and managing the system section data on the basis of a difference in the estimated output data distribution region.

The region in which the pieces of output data are distributed is divided into a plurality of regions from the results of the interpretation and the analysis of the plurality of pieces of system section data, a plurality of output data distribution rules indicating a relationship between a region in which parameters of the output data are distributed and the input data are derived for each parameter of the output data, and a plurality of distribution region candidates of the output data are estimated by applying the plurality of output data distribution rules to new input data.

According to this technology, since the distribution of output data can be predicted before analysis with respect to input data of a power system, it is possible to detect failure signs due to the weakness or irrecoverableness of the power system without spending time on analysis. Meanwhile, in addition to the power system, this technology can also be utilized for analysis for the establishment of a facility maintenance plan of a water distribution system for providing clean water to consumers. For example, the strengths of the ground for each maintenance location of a facility and each area are used as input parameters, and a location having a risk such as water leakage or piping rupture at the time of occurrence of an earthquake and the number of households to be affected are used as output parameters. By analyzing this water distribution system, it is possible to predict a recovery cost and a damage range at the time of occurrence of a disaster. From a prediction result, the maintenance plan can be corrected so as to reduce the recovery cost and the damage range at the time of a disaster. In addition, similar analysis can be applied to city gas piping.

Hereinafter, an embodiment of the invention will be described with reference to the accompanying drawings.

EXAMPLE 1

<Basis: Prediction of Output Data>

In Example 1, a distribution region of a plurality of pieces of output data obtained by analyzing a plurality of pieces of input data by a system section data analysis device is divided. Description will be given of an example in which it is estimated to which region, among the plurality of divided regions, output data which is an analysis result of input data desired to be newly analyzed is distributed. For example, according to Example 1, since the distribution of output data can be predicted before analyzing input data of a power system, it is possible to detect a sign of a failure or the like in the power system or a water supply system.

Further, in a case where it takes time to analyze system section data, system operation and planning work including analysis for comparing and verifying different analysis results by preferentially analyzing input data having different distributions of output data can be made efficient, as compared to a case where output data predicted before the analysis has the same distribution as past analysis results.

Hereinafter, an example of system section data dealt with here, an example of a plurality of parameters in a case where the system section data is used as input data of the system section data analysis device, and an example of a plurality of parameters constituting output data of the system section data analysis device and a distribution of the plurality of parameters will be described, and a system section data management device and a method thereof for estimating an output data distribution region will be described.

<Example of Interpretation and Analysis of Section Data>

FIG. 1 illustrates an example of system section data which is a data management target in Example 1. System section data 102 of FIG. 1 is data obtained by cutting out facilities such as power supplies and substations which are included in a power system 101 and a connection relationship therebetween at a certain time. The system section data 102 includes amounts of power generated by the power supplies, the phase of a power transmission line end for connecting the substations and connecting the power supplies and the substations, and the like as parameters. The parameters vary for each time of cut-out, and system section data at a plurality of times of the past, the present time, and the future (plan) is managed in accordance with a distribution of analysis results.

Figure 2:
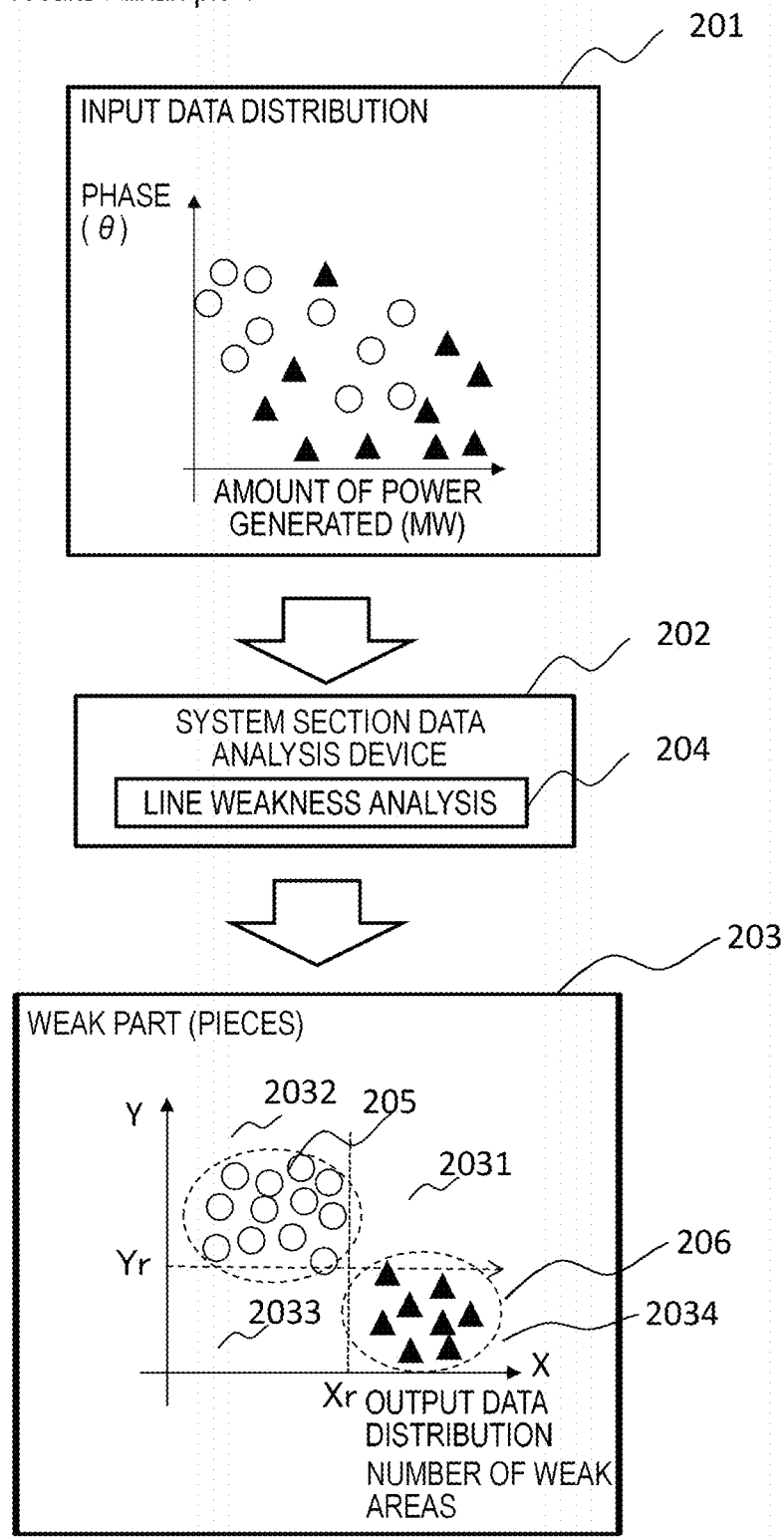
FIG. 2 is a diagram illustrating an example of distribution of system section data analysis results.

FIG. 2 illustrates an example of a distribution of results of line weakness analysis using system section data as input data. For example, focusing on one power supply A 103 included in the system section data 102, when the amount of power generated (MWh) and a phase (theta) are respectively taken for an X-axis and a Y-axis and a system section is plotted for each target time, an input data distribution 201 having two parameters of the amount of power generated and a phase of the power supply A is obtained. When a distribution of results obtained by analyzing pieces of data included in the input data distribution 201 using a system section data analysis device 202 is plotted, an output data distribution 203 is obtained.

In Example 1, description will be given of an example in which the system section data analysis device 202 executes line weakness analysis 204. The line weakness analysis 204 is analysis for predicting whether or not recovery is possible from an N-1 state in a case where one of power transmission lines of the power system is unusable due to a certain cause. By executing this analysis, the number of weak parts and the number of weak areas in the power system are known.

In the output data distribution 203, a distribution of output data is expressed with respect to results of the line weakness analysis 204 by taking the number of weak areas for the horizontal axis (X-axis), taking the number of weak parts for the vertical axis (Y-axis), and respectively associating two parameters of the number of weak parts and the number of weak areas with the X-axis and the Y-axis. In Example 1, the number of parameters is set to two, but the number of parameters may be increased in response to the number of axes in a case where the number of parameters is desired to be increased.

In the example illustrated in FIG. 2, division into a local majority group 205 having a large number of weak parts but a small number of weak areas and a wide range minority group 206 having a small number of weak parts but a large number of weak areas is performed. Description will be given below of an example of a system section data management device that estimates such an output data distribution before the output data distribution is analyzed by a system section data analysis device, classifies system section data on the basis of estimation results, and manages the classified system section data.

<System Section Data Management Device: Configuration>

Figure 3:
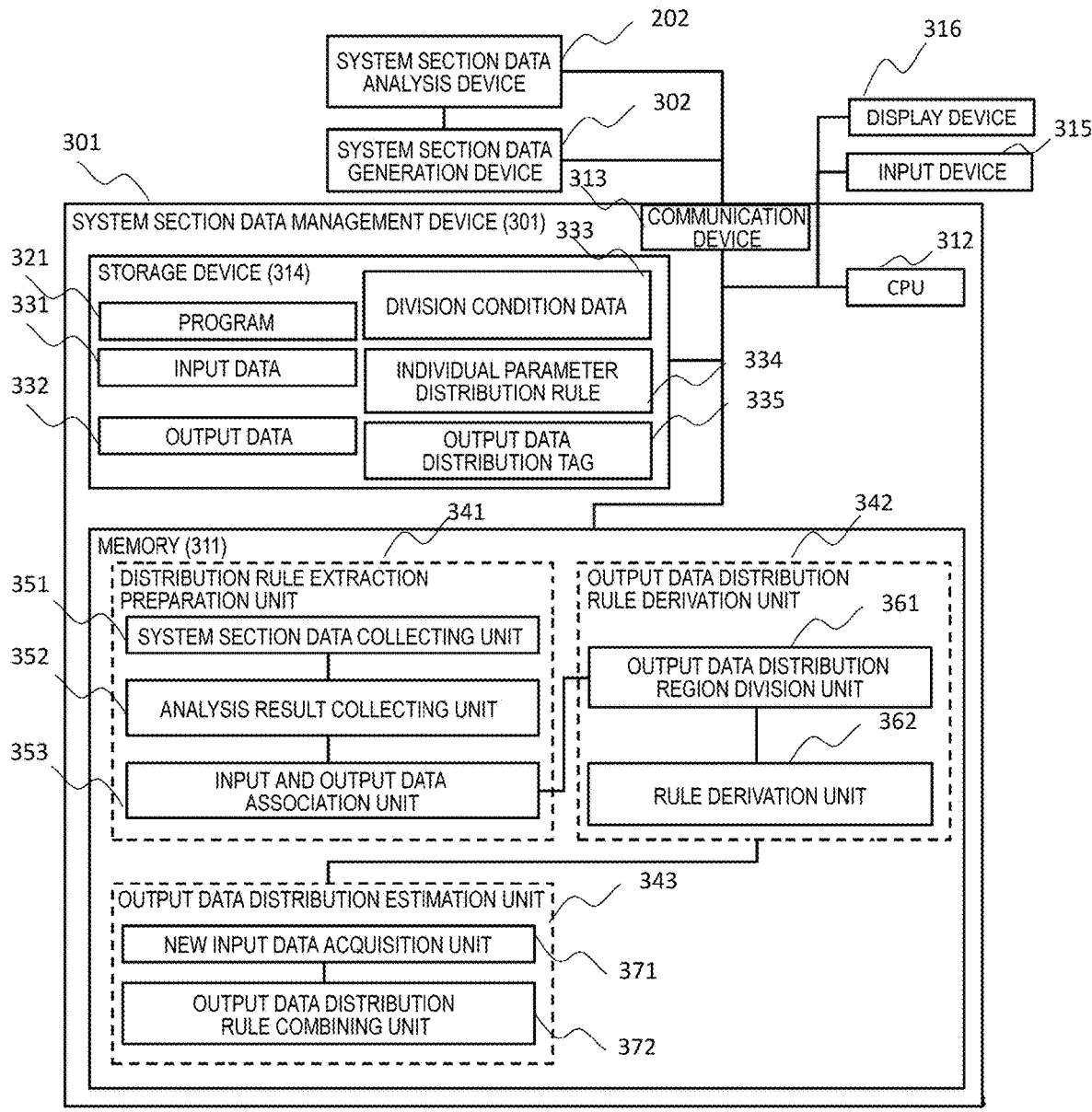
FIG. 3 is a diagram illustrating an example of a system section data management device.

FIG. 3 is a diagram illustrating a configuration example of a device that realizes the management of system section data in Example 1.

A system section data management device 301 can be realized using a general computer including a memory 311, a CPU 312, a communication device 313, a storage device 314 such as a hard disk, an input device 315, and a display device 316.

The input device 315 is a device for inputting an instruction to a computer, such as a keyboard or a mouse, and inputs an instruction such as the start-up of a program. The display device 316 is a display or the like, and displays execution conditions, execution results, and the like of a process performed by the system section data management device 301. The CPU 312 executes various programs stored in the memory 311. The communication device 313 exchanges various pieces of data and commands with another device through a local area network (LAN) or the like. The storage device 314 stores various programs 321 for executing the system section data management device 301, input data 331 which is a set of parameter values included in system section data at various times which is generated by a system section data generation device 302, output data 332 that includes a plurality of parameter values of results obtained by analyzing the system section data by the system section data analysis device 202, division condition data 333 which is a division condition for dividing an output data distribution region, an individual parameter distribution rule 334 for estimating where analysis results of the input data 331 are distributed in the output data distribution region, and an output data distribution tag 335 of results which are narrowed down by combining a plurality of individual parameter distribution rules 334.

The CPU 312 included in the system section data management device 301 causes the memory 311 to read out the program 321 and various pieces of data stored in the storage device 314 to executes the program and various pieces of data. The program 321 includes a distribution rule extraction preparation unit 341, an output data distribution rule derivation unit 342, and an output data distribution estimation unit 343.

<System Section Data Management Device: Overall Processing Flow>

Figure 4:
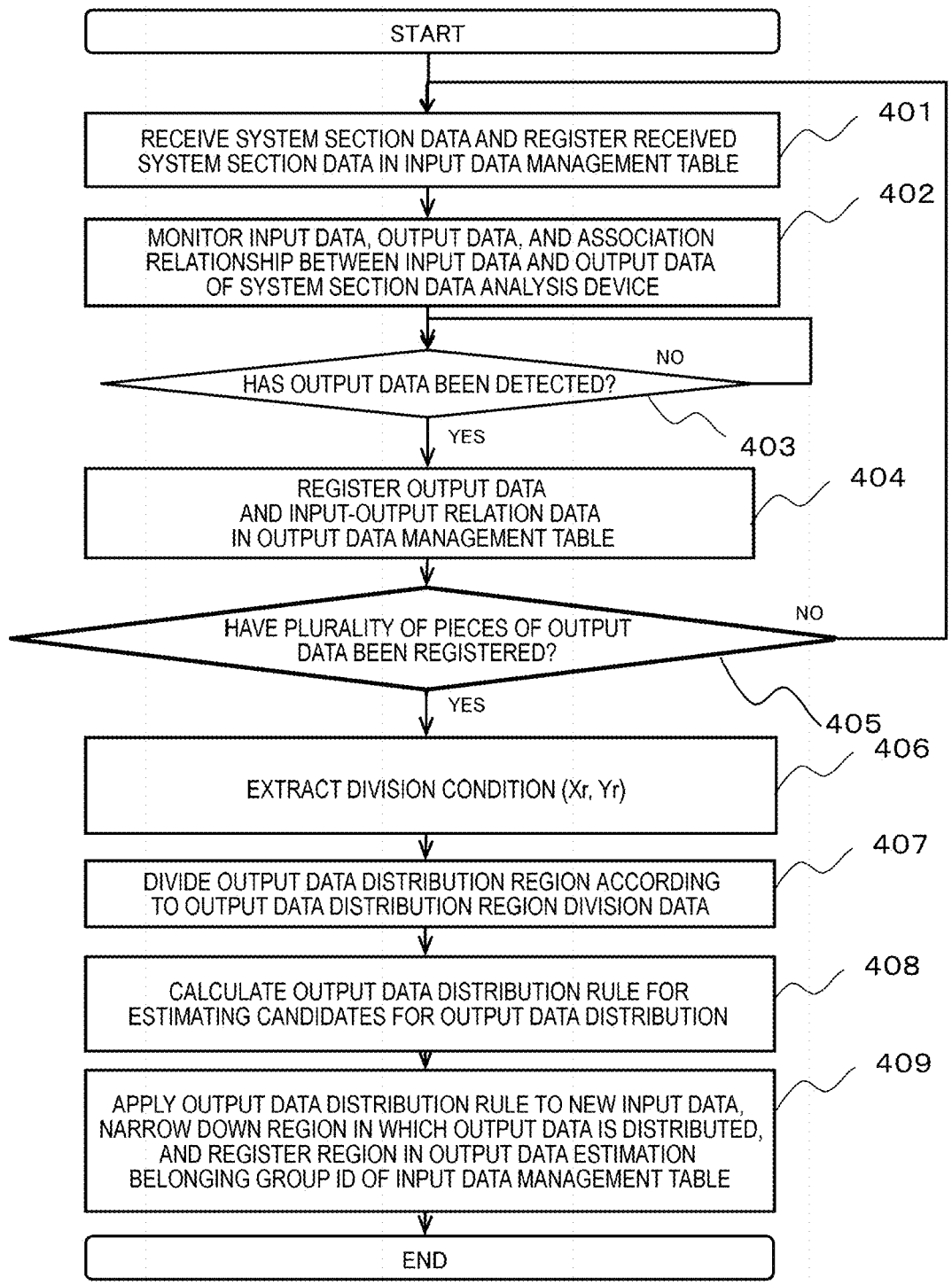
FIG. 4 is a diagram illustrating an outline of a processing flow of the system section data management device.

FIG. 4 is a diagram illustrating an outline of a processing flow of the system section data management device. That is, FIG. 4 illustrates a process in which the system section data management device illustrated in FIG. 3 derives an output data distribution rule from a relation between distributions of first input data of the system section data analysis device and first output data which is analysis results of the first input data. This is an example of a processing flow in which by applying the output data distribution rule to second input data, an output data distribution region to which second output data belongs is estimated before the second input data is analyzed. After an outline of this processing flow is described, details of each processing unit will be described.

First, the distribution rule extraction preparation unit 341 receives system section data generated by the system section data generation device 302 and registers the received system section data in an input data management table 501 illustrated in FIG. 5 (Process 401). The input data management table 501 is stored as the input data 331 stored in the storage device 314 illustrated in FIG. 3. Thereafter, input data which is input to the system section data analysis device, output data, and an association relationship between the input data and the output data are monitored (Process 402).

Figure 6:
FIG. 6 is a diagram illustrating an example of an output data management table.

After output data is detected in Process 403, the output data and input-output relation data which is an association relationship between input data and the output data are registered in an output data management table 601 illustrated in FIG. 6 (Process 404). The output data management table 601 is stored as the output data 332 stored in the storage device 314 illustrated in FIG. 3. Association between input data and output data will be described. The system section data management device 301 imparts an input ID to input data at the time of registering system section data which is input data received from the system section data generation device 302 in the input data management table 501. The system section data analysis device 202 analyzes the input data which is received from the system section data management device 301 and has the input ID imparted thereto, attaches an input ID to an analysis result, and transmits the analysis result to the system section data management device 301, so that an input and output data association unit 353 performs association and registration in the output data management table 601 illustrated in FIG. 6. This processing that has been described so far is the processing of the distribution rule extraction preparation unit 341.

The output data distribution rule derivation unit 342 starts processing after a plurality of pieces of output data are registered in the output data management table, and extracts a division condition (Xr, Yr) for dividing the output data distribution region into a plurality of parameter values included in output data (Process 406). A plurality of pieces of output data are read out from the output data management table 601, and the read-out plurality of pieces of output data has an output data distribution obtained by plotting output data by respectively setting two parameters of the number of weak areas X and a weak part Y among the plurality of output parameters of the plurality of pieces of output data to be the X-axis and the Y-axis. In addition, a division condition is calculated from the output data distribution. Since the output data is constituted by two parameters of a weak part and the number of weak areas, the number of weak areas and the weak part are respectively set to be the X-axis and the Y-axis, and a distribution region of output data N (Xn, Yn) is divided according to whether the number of weak areas is equal to or greater than Xr or less than Xr and whether the weak part is equal to greater than Yr or less than Yr. The set of Xr and Yr is an example of a division condition.

In Process 407, an output data distribution region is divided according to a division condition. For example, when it is assumed that Xr and Yr described above are extracted as a division condition, an output data distribution region is divided into four regions including a first region 2301 satisfying the relations of Xn>Xr and Yn>Yr (see FIG. 2), a second region 2302 satisfying the relations of Xn<Xr and Yn>Yr, a third region 2033 satisfying the relations of Xn<Xr and Yn<Yr, and a fourth region 2034 satisfying the relations of Xn>Xr and Yn<Yr with respect to the output data N (Xn, Yn), it is determined which of the four regions the output data belongs, and an output data belonging group ID is attached thereto. For example, G001 is attached to an output data belonging group in a case where the divided output data is present in the first region, and G002 is attached to an output data belonging group in a case where the divided output data is present in the second region. The output data belonging groups are registered as output data belonging groups of the input data management table of FIG. 5 and the output data management table of FIG. 6.

In Process 408, an output data distribution rule for estimating distribution candidates of output data in a case where the output data distribution rule derivation unit 342 analyzes input data by the system section data analysis device 202 is calculated.

For example, in a case where a division condition is Xr and Yr described above, an input data aggregate having an association relationship with output data equal to or greater than Xr is set to be a first input data group, and calculating is performed by using a rule belonging to the first input data group as a first output data distribution rule. Similarly, regarding Yr, a second output data distribution rule is calculated. In the first output data distribution rule, it can be estimated that the first or fourth region is calculated to be a first output data distribution region candidate when Xn is equal to or greater than Xr with respect to the output data N (Xn, Yn), and the second or third region is calculated to be a first output data distribution region candidate when Xn is less than Xr. In the second output data distribution rule, it can be estimated that the first or second region is calculated to be a second output data distribution region candidate when Yn is equal to or greater than Yr with respect to the output data N (Xn, Yn), and the third or fourth region the output data distribution candidate are calculated to be a second output data distribution region candidate when Yn is less than Yr.

Finally, in Process 409, the output data distribution estimation unit 343 applies the output data distribution rule to new input data before the new input data is input to the system section data analysis device 202 and narrows down a region in which output data which is analysis results of the analysis device is distributed to estimate an output data distribution. The results thereof are registered in an output data estimation belonging group ID of the input data management table 501. For example, G001 indicates the first region, G002 indicates the second region, G003 indicates the third region, and G004 indicates the fourth region.

In a case where there are a first output data distribution rule related to Xn and a second output data distribution rule related to Yn for the output data N (Xn, Yn) described above, a candidate is estimated by applying the first output data distribution rule related to the X-axis to new input data to determine whether output data is the first or fourth region or the second or third region. Subsequently, a candidate is estimated by applying the second output data distribution rule related to the Y-axis to new input data to determine whether output data is the first or second region or the third or fourth region. It is possible to narrow down a region to which the output data belongs from the four regions to the first region by combining the candidates estimated according to the first and second output data distribution rules.

<Distribution Rule Extraction Preparation Unit>

In the distribution rule extraction preparation unit 341, input and output data is collected by monitoring the system section data analysis device 202 in order to calculate a division condition and an output data distribution rule, so that an input data aggregate is managed using the input data management table of FIG. 5 and an output data aggregate is managed using the output data management table of FIG. 6.

Figure 7:
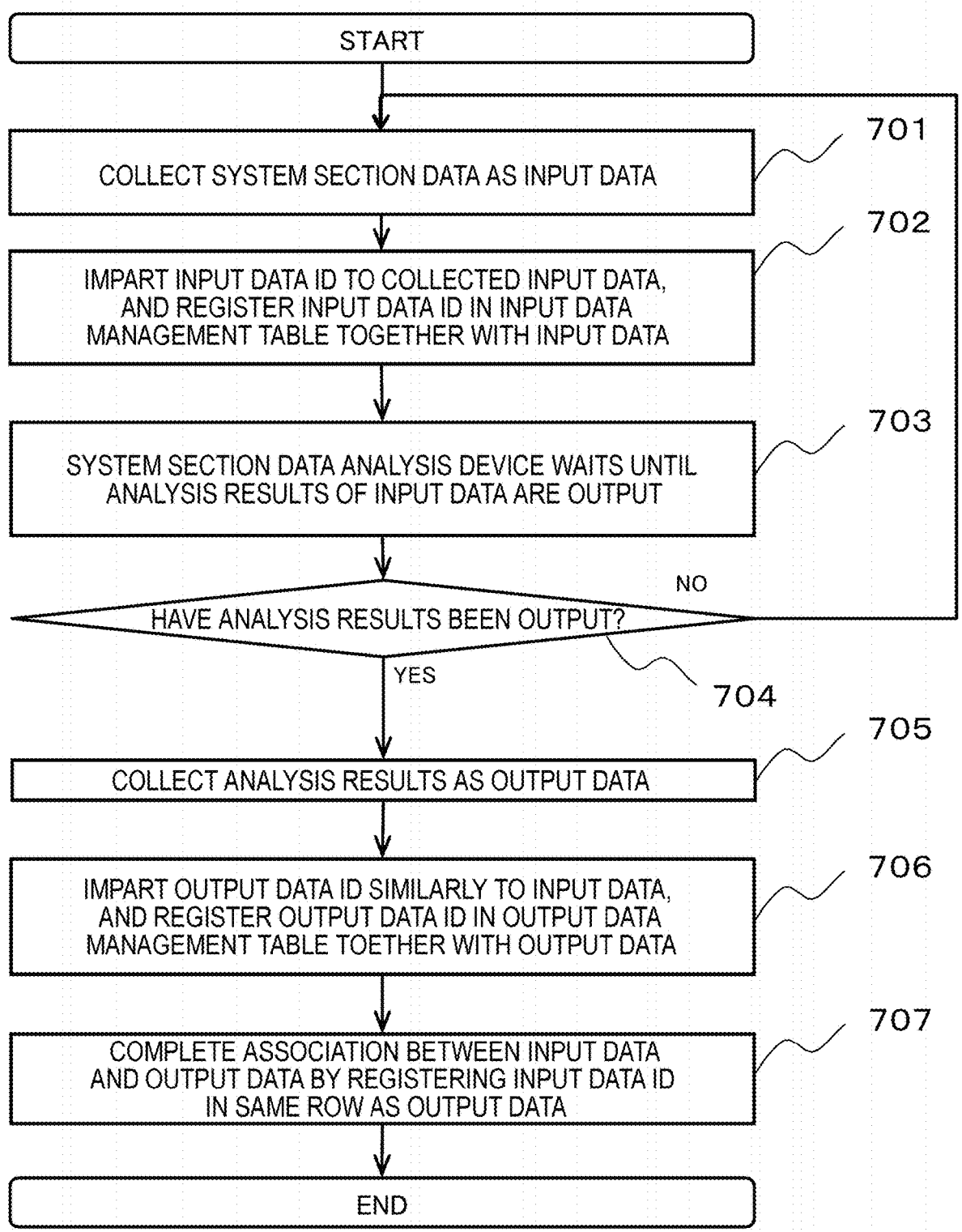
FIG. 7 is a diagram illustrating a distribution rule extraction preparation flow.

FIG. 7 illustrates a distribution rule extraction preparation flow executed by the distribution rule extraction preparation unit 341. By this processing, the input data aggregate managed using the input data management table (FIG. 5) and the output data aggregate managed using the output data management table (FIG. 6) are stored in the storage device 314 in association with each other.

First, the system section data collecting unit 351 monitors the system section data analysis device 202 and collects system section data to be input as input data (Process 701).

An input data ID for discrimination from other input data is imparted to the collected input data, and the input data ID is registered in the input data management table 501 of the storage device 314 together with a plurality of parameters included in the input data (Process 702).

For example, the plurality of parameters include values of an output and a phase of the power supply A. Subsequently, the system section data analysis device 202 analyzes the input data and waits until results of the analysis are output as output data (Process 703).

In Process 704, an analysis result collecting unit 352 collects the analysis results as output data when it is detected that the results have been output (Process 705).

Thereafter, an output data ID for discrimination from other output data is imparted similar to the input data, and the output data ID is registered in the output data management table 601 of the storage device 314 together with a plurality of parameters included in the output data (Process 706).

For example, the plurality of parameters include the number of weak areas and the number of weak parts. Finally, the input and output data association unit 353 registers the input data ID in the same row as the output data to complete association between the input data and the output data (Process 707).

<Output Data Distribution Rule Derivation Unit: Outline>

The output data distribution rule derivation unit 342 derives an output data distribution rule making it possible to estimate distribution candidates of output data of results obtained by analyzing input data by the system section data analysis device 202 before analysis using information of an input data aggregate managed using the input data management table 501, an output data aggregate managed using the output data management table 601, and an association relationship (input data ID) with input data.

The output data distribution rule derivation unit 342 is constituted by two processing units. The processing units are respectively an output data distribution region division unit 361 that divides a distribution region of output data into a plurality of regions and a rule derivation unit 362 that derives a rule for estimating a candidate for a region in which output data is distributed from input data before analysis. Hereinafter, details of each processing unit will be described.

<Output Data Distribution Region Division Unit>

In Example 1, system section data serving as input data is managed according to which region output data belongs to. For this reason, since there is no difference in a belonging region when all of the pieces of output data are in the same region, input data cannot be classified by a difference in output data to be estimated. In addition, data management such as a change in the priority of processing of input data cannot be performed. In Example 1, in order to cause a difference in the belonging region, the output data distribution region division unit 361 divides an output data distribution region so that an output data aggregate is distributed to a plurality of regions without being biased to one specific region.

Meanwhile, the output data distribution region is a region in which output data may be present. For example, output data is constituted by two parameters including the number of weak areas X and a weak part Y, and it is assumed that any output data N is expressed by $(X_n, Y_n)$. In a case where a minimum value and a maximum value of the number of weak areas are respectively set to be Xmin and Xmax and a minimum value and a maximum value of a weak part are respectively set to be Ymin and Ymax, the output data $(X_n, Y_n)$ is distributed within a range in which two conditions of $Xmin \leq X_n \leq Xmax$ and $Ymin \leq Y_n \leq Ymax$ are satisfied. This distribution range is an output data distribution region.

Figure 8:
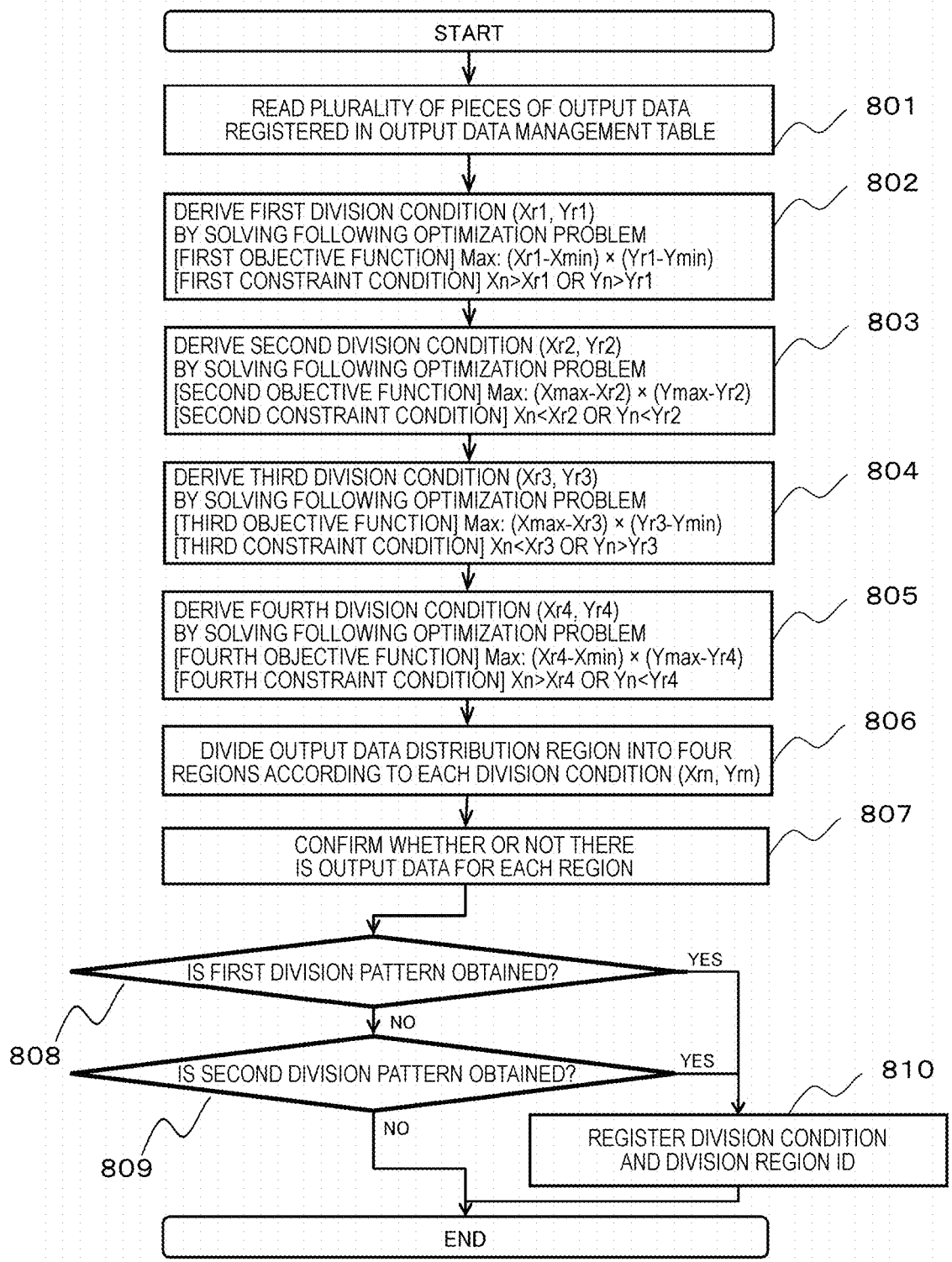
FIG. 8 is a diagram illustrating an output data distribution region division flow.

The output data distribution region division unit 361 divides an output data distribution region according to an output data distribution region division flow. An example thereof is illustrated in FIG. 8. In a processing flow of the output data distribution region division unit 361, four patterns each including a division condition $X_{rn}$ for dividing a region according to the magnitude of the number of weak areas X and a division condition $Y_{rn}$ for dividing a region according to the magnitude of the weak part Y are generated, and one specific pattern is selected so that output data is distributed to a plurality of regions. Hereinafter, details thereof will be described.

First, in Process 801, the output data distribution region division unit 361 reads a plurality of pieces of output data registered in the output data management table 601. The plurality of read-out pieces of output data are set to be an output data distribution in which two parameters including the number of weak areas X and the weak part Y, among a plurality of output parameters, are plotted for the X-axis and the Y-axis.

Thereafter, in Process 802, a parameter of any output data N is set to be $X_n$ and $Y_n$, a maximum value of each parameter of the output data is set to be Xmax and Ymax, and a minimum value is set to be Xmin and Ymin, and a first division condition $(X_{r1}, Y_{r1})$ is derived by solving the following first optimization problem.

[First objective function] Max: $(X_{r1}-Xmin) \times (Y_{r1}-Ymin)$

[First constraint condition] $X_n > X_{r1}$ or $Y_n > Y_{r1}$

According to this first optimization problem, the parameters $X_n$ and $Y_n$ of any output data N have a constraint condition of $X_n > X_{r1}$ or $Y_n < Y_{r1}$, and $X_{r1}$ and $Y_{r1}$ having a maximized value of a product $(X_{r1}-Xmin) \times (Y_{r1}-Ymin)$ of a distance between $X_{r1}$ and Xmin and a distance between $Y_{r1}$ and Ymin as an objective function are obtained.

In Process 803, Process 804, and Process 805, division conditions including a second division condition $(X_{r2}, Y_{r2})$, a third division condition $(X_{r3}, Y_{r3})$, and a fourth division condition $(X_{r4}, Y_{r4})$ are derived from the following objective functions and constraint conditions, similar to the first individual parameter distribution rule.

[Second objective function] Max: $(Xmax-X_{r2}) \times (Ymax-Y_{r2})$

[Second constraint condition] $X_n < X_{r2}$ or $Y_n < Y_{r2}$

[Third objective function] Max: $(Xmax-X_{r3}) \times (Y_{r3}-Ymin)$

[Third constraint condition] $X_n < X_{r3}$ or $Y_n > Y_{r3}$

[Fourth objective function] Max: $(X_{r4}-Xmin) \times (Ymax-Y_{r4})$

[Fourth constraint condition] $X_n > X_{r4}$ or $Y_n < Y_{r4}$

In Process 806, an output data distribution region is divided into four regions according to each division condition $(X_{rn}, Y_{rn})$. A first region is set to be $X > X_{rn}$ and $Y > Y_{rn}$, a second region is set to be $X < X_{rn}$ and $Y > Y_{rn}$, a third region is set to be $X < X_{rn}$ and $Y < Y_{rn}$, and a fourth region is set to be $X > X_{rn}$ and $Y < Y_{rn}$.

Figure 9:
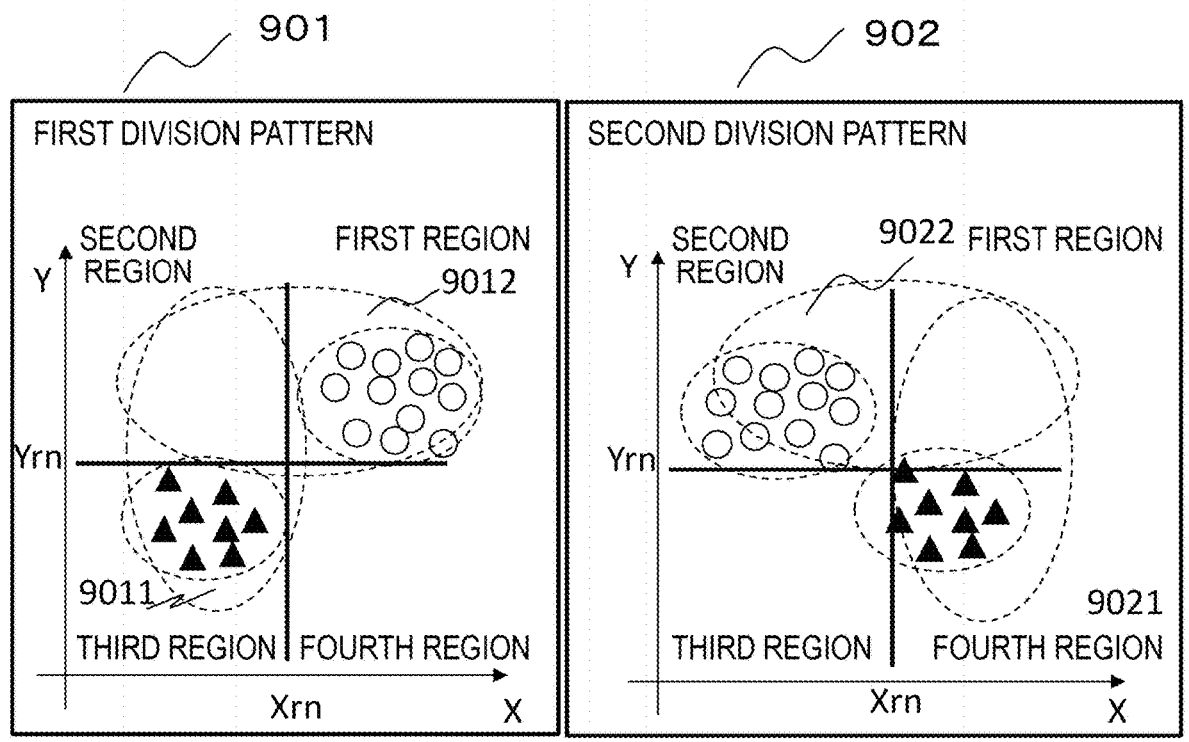
FIG. 9 is a diagram illustrating an example of an output data distribution region division pattern.

Thereafter, in Process 807, it is confirmed whether or not each of the regions includes output data. In a case where the first region and the third region include output data, a first division pattern 901 illustrated in FIG. 9 is obtained (Process 808). In a case where the second region and the fourth region include output data, a second division pattern 902 illustrated in FIG. 9 is obtained (Process 809). Each division condition $(X_{rn}, Y_{rn})$ is set appropriately so that an output data distribution region has either a first division pattern or a second division pattern. In FIG. 9, the vertical axis X represents the number of weak areas and the horizontal axis $Y_n$ represents a weak part, similar to the output data distribution illustrated in FIG. 2.

A region ID and a division pattern ID indicating a division condition and each region are registered in an output data distribution region management table 1001 illustrated in FIG. 10 (Process 810), and the process is terminated. For example, it is assumed that a division region ID 1 indicates the first division pattern 901 and a division region ID 2 indicates the second division pattern 902. When the division pattern ID is, for example, "1-1", the first "1" means a first division pattern, and the next "1" is a serial number. The output data distribution region management table 1001 is stored in division condition data 333 of the storage device 314 of the system section data management device.

<Output Data Distribution Rule Derivation Unit>

In the rule derivation unit 362, an output data distribution rule for estimating a candidate for an output data distribution region in which output data which is an analysis result is distributed before analyzing input data is derived. The output data distribution rule is a rule for setting an input data aggregate corresponding to an output data aggregate which is present in a specific region to be an input data group and determining whether or not new input data belongs to the input data group. The rule derivation unit 362 derives a plurality of output data distribution rules for each division pattern ID registered in the output data distribution region management table 1001. Hereinafter, a process of deriving an output data distribution rule executed by the rule derivation unit 362 with reference to an input data group management table 1701 of FIG. 17 and an output data distribution rule derivation flow of FIG. 16 for managing an input data group generated in a stage of deriving an output data distribution rule will be described in detail. Meanwhile, here, a case in which an output data distribution region is divided into four regions in each of the first division pattern 901 and the second division pattern 902 is used as a specific example.

Figure 16:
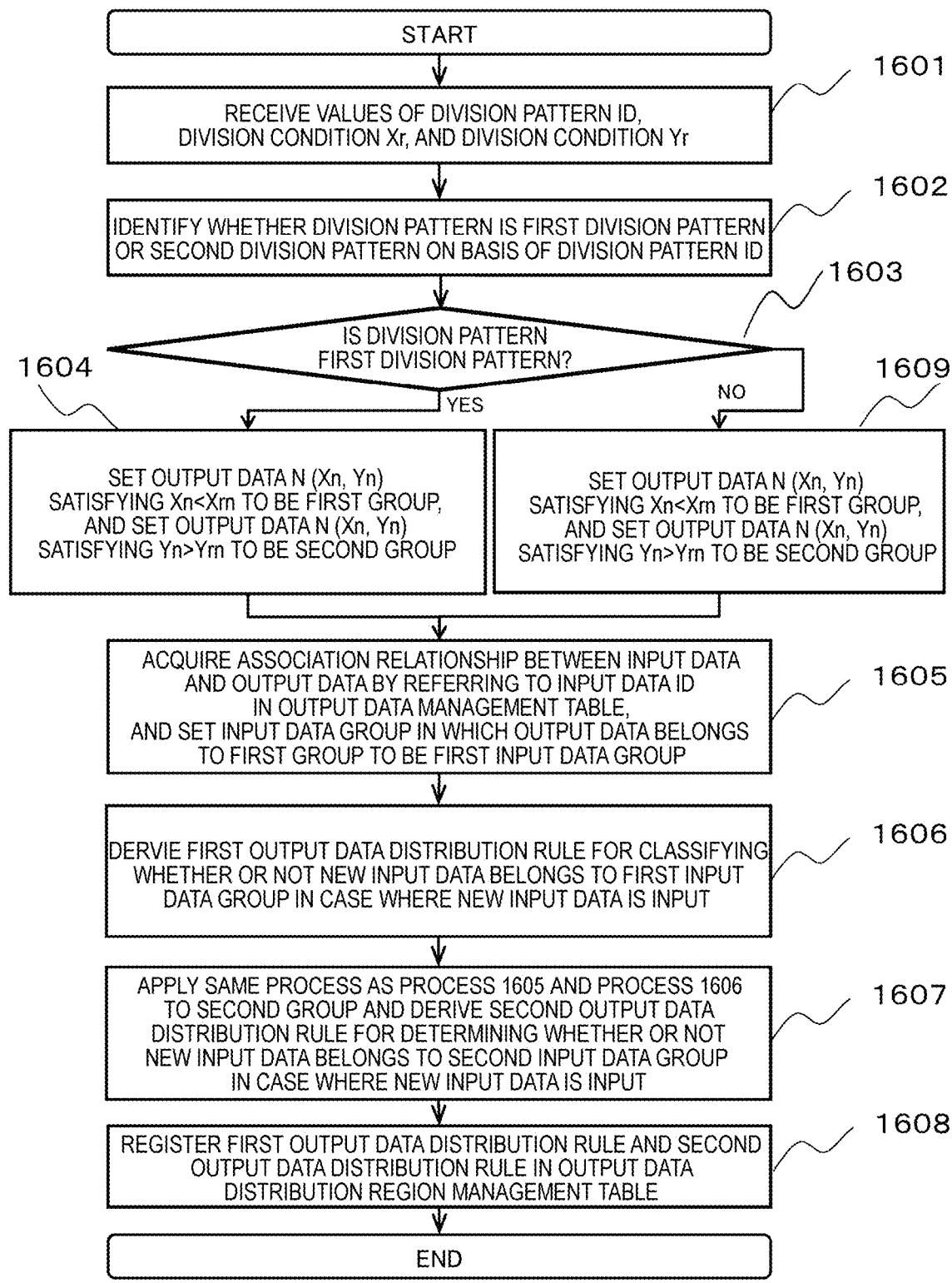
FIG. 16 is a diagram illustrating an output data distribution rule derivation flow.

FIG. 16 is a diagram illustrating an output data distribution rule derivation flow executed by the rule derivation unit 362.

First, in Process 1601 illustrated in FIG. 16, the output data distribution region division unit 361 receives values of a division pattern ID, a division condition Xr, and a division condition Yr which are registered in the output data distribution region management table 1001.

In Process 1602, since the first division pattern 901 is registered as a division region ID 1 and the second division pattern 902 is registered as a division region ID 2 in the output data distribution region management table 1001, it is identified whether a division pattern is the first division pattern or the second division pattern illustrated in FIG. 9 on the basis of the division pattern ID.

The process proceeds to Process 1604 when the division pattern is the first division pattern, and the process proceeds to Process 1609 when the division pattern is the second division pattern. In Process 1604, an output data aggregate is acquired with reference to the output data management table 601, and output data N (Xn, Yn) satisfying Xn<Xrn and output data N (Xn, Yn) satisfying Yn>Yrn are set to be a first group 9011 and a second group 9012, respectively. Specifically, the output data is set to be the first group 9011 when the number of weak areas Xn is smaller than a division condition Xrn, and the output data is set to be the second group 9012 when the number of weak parts Yn is larger than a division condition Yrn (see FIG. 9). An input data aggregate corresponding to the first group 9011 of the output data N is set to be a first input data group, and an input data aggregate corresponding to the second group of the output data N is set to be a second input data group.

Next, in Process 1605, an association relationship of output data is acquired with reference to the input data ID in the output data management table 601, and an input data aggregate in which output data belongs to the first group is set to be a first input data group. The first input data group is added to an input data group in the same row as both the division pattern ID identified in Process 1602 and the division region ID identified as the first group or the second group in Process 1604 or Process 1609 in the input data group management table 1701 of FIG. 17. For example, in a case where a division pattern ID is 1-1 and a division region ID is 1 (first division pattern), an input data ID is added to a first input data group 1702.

Figure 17:
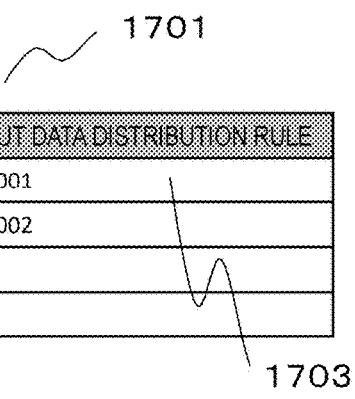
FIG. 17 is a diagram illustrating an example of an input data group management table.

In Process 1606, in a case where new input data is input, a first output data distribution rule for determining whether the input data belongs to the first input data group is derived, and an ID indicating the rule is registered in an output data distribution rule 1703 of FIG. 17. For example, a pattern identification method such as SVM using a first input data group as correct solution data is used for the derivation of the output data distribution rule.

Subsequently, in Process 1607, the same processes as Process 1605 and Process 1606 are applied to the second group, and a second output data distribution rule for classifying whether or not new input data belongs to the second input data group in a case where the new input data is input is derived. As a result, in a case where the new input data belongs to the second input data group, the second input data group is added to an input data group in the same row as both the division pattern ID identified in Process 1602 and the division region ID identified as the first group or the second group in Process 1604 or Process 1609 in the input data group management table 1701 of FIG. 17.

In Process 1608, the first output data distribution rule and the second output data distribution rule are registered in the output data distribution rule 1703 illustrated in FIG. 17. Thereby, it is possible to create an input data group management table in which an ID indicating a division pattern related to output data, a division region ID indicating a division region, an input data group corresponding to output data included in the division pattern and the division region, and an output data distribution rule are associated with each other. In addition, the output data distribution rule is registered in the output data distribution region management table 1001 together with a division region ID and a division pattern ID corresponding thereto. As illustrated in FIG. 10, in Example 1, two output data distribution rules related to the X-axis and the Y-axis are registered in association with the same division region ID.

In Process 1609, a process in a case of the second division pattern is performed. In a case of the second division pattern, output data N (Xn, Yn) satisfying Xn>Xrn is set to be a first group 9021, and output data N (Xn, Yn) satisfying Yn>Yrn is set to be a second group 9022 (see FIG. 9). Thereafter, Process 1605 to Process 1607 are executed, and the first and second output data distribution rules are registered in the output data distribution management table 1001 in Process 1608 to complete the process.

The output data distribution rule in the input data group management table illustrated in FIG. 17 is applied to new input data, and it can be determined to which input data group the new input data belongs. Further, a candidate for an output distribution belonging region after analysis performed on the new input data can be estimated from a division pattern ID and a division group ID in the same row before the analysis.

Further, both the first output data distribution rule and the second output data distribution rule which are registered in the output data distribution region management table of FIG. 10 are applied to new input data, so that it is possible to narrow down candidates for of an output distribution belonging region after analysis. Candidates are estimated before analysis in this manner, and thus it is possible to analyze other new input data without executing analysis itself in a case where it is determined that analysis results are not necessary. Thereby, it is possible to reduce unnecessary analysis and improve the efficiency of analysis.

Regarding the belonging region, for example, it is possible to estimate that output data is distributed in the region 9012 over the first and second regions in the first division pattern 901 of the output data distribution of FIG. 9 by applying the first output data distribution rule. On the other hand, it is possible to estimate that output data is distributed in the region 9011 over the second and third regions in the first division pattern 901 of the output data distribution of FIG. 9 by applying the second output data distribution rule. Candidates for the plurality of pieces of output data distribution regions are combined with each other, and thus it is possible to narrow down the output data distribution regions to the overlapping region thereof. Hereinafter, a process of narrowing down output data distribution regions which is performed by the output data distribution estimation unit 343 will be described.

<Individual Parameter Distribution Rule Combining Unit>
<Output Data Distribution Estimation Unit: Outline>

The output data distribution estimation unit 343 estimates an output data distribution of the system section data analysis device from input data by combining a plurality of output data distribution rules derived by the output data distribution rule derivation unit 342 with each other.

Figure 11:
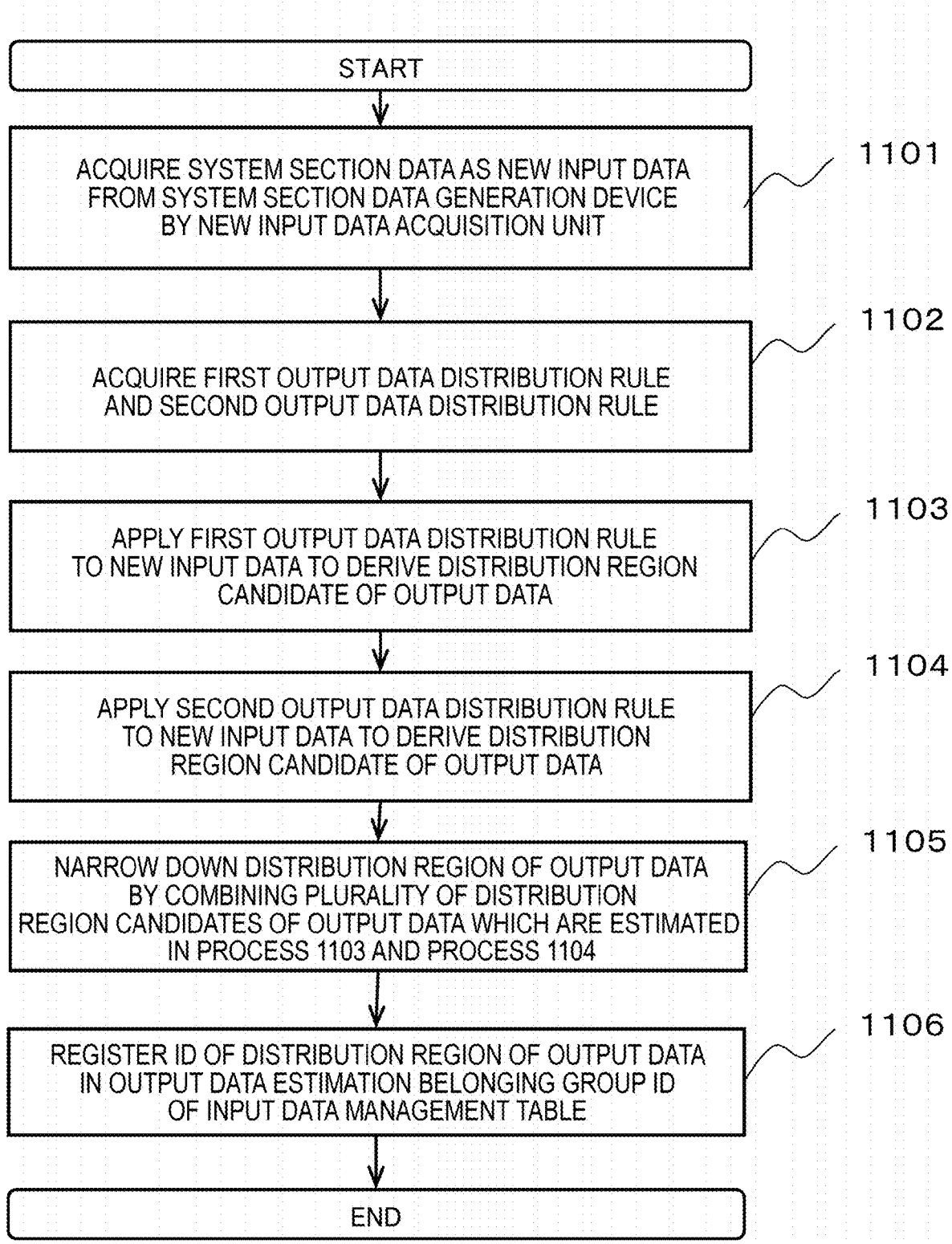
FIG. 11 is a diagram illustrating an output data distribution estimation flow.

The output data distribution estimation unit 343 is constituted by two processing units. The processing units are respectively a new input data acquisition unit 371 that acquires input data for which an output data distribution is to be estimated after analysis and an output data distribution rule combining unit 372 that estimates an output data distribution by applying a plurality of output data distribution rules to the input data acquired by the new input data acquisition unit 371. Hereinafter, the estimation of an output data distribution which is realized by the new input data acquisition unit 371 and the output data distribution rule combining unit 372 will be described according to an output data distribution estimation flow illustrated in FIG. 11.

<Output Data Distribution Estimation Unit>

First, in Process 1101, the new input data acquisition unit monitors the system section data generation device 302. When the system section data generation device 302 generates system section data which is input to the system section data analysis device, the new input data acquisition unit acquires the system section data as new input data, and the process proceeds to Process 1102.

In Process 1102, the output data distribution rule combining unit 372 acquires a first output data distribution rule (for example, a rule corresponding to the X-axis) and a second output data distribution rule (for example, a rule corresponding to the Y-axis) which are written in any row from the output data distribution region management table 1001. Here, a row to be selected may be any one row, and the following Process 1103 to Process 1106 may be performed on a plurality of rows or all of the rows.

Thereafter, in Process 1103, the first output data distribution rule is applied to new input data, and it is estimated whether the new input data belongs to the first group or not (non-belonging). For example, in the first division pattern 901 of FIG. 9, the first output data distribution rule can be divided into a case where output data belongs to the first group satisfying $Xn<Xrn$ and a case where $Xn<Xrn$ is not satisfied. Regarding a relationship between this and the first to fourth regions, in the first division pattern 901, a candidate for an output data distribution region, and the first region or the fourth region when the output data belongs to the first group is estimated.

In Process 1104, the second output data distribution rule is applied to new input data, and it is estimated whether the new input data belongs to the second group or not (non-belonging). For example, in the first division pattern 901 of FIG. 9, the second output data distribution rule can be divided into a case where output data belongs to the second group satisfying $Yn>Yrn$ and a case where $Yn>Yrn$ is not satisfied. In the first division pattern 901, a candidate for an output data distribution region, and the first region or the second region when the output data belongs to the second group is estimated.

In Process 1105, output data distribution regions are narrowed down by combining the plurality of output data distribution region candidates which are estimated from the first and second output data distribution rules in Process 1103 and Process 1104 with each other. For example, when an output data distribution region candidate is estimated to be the first or fourth region in Process 1103 and an output data distribution region candidate is estimated to be the first or second region in Process 1105, an output data distribution region can be estimated to be the first region according to a combination thereof.

In Process 1106, an ID of the output data distribution region narrowed down in Process 1105 is registered in an output data estimation belonging group ID in the input data management table 501, and the process is terminated. Meanwhile, in Process 1102, a plurality of rows are selected from the output data distribution region management table 1001, and a plurality of output data estimation belonging group IDs are registered in a case where these IDs are derived.

According to Example 1, it is possible to estimate an output data distribution region according to an output data distribution rule which is derived from a pattern of an output data distribution even when a relation between input data and output data is non-linear. Thereby, with respect to a power system known as output data having a non-linear relationship with input data, a distribution of output data can be predicted before the input data is analyzed by an analysis device, and thus it is possible to detect a sign of a failure or the like in the power system or a water supply system.

For example, even when output data is not present in the fourth region as shown by the first division pattern 901 of FIG. 9, it is possible to estimate that output data is distributed in the fourth region by applying the plurality of first and second output data distribution rules to input data.

Further, in Example 1, although output data is assumed to be data constituted by two parameters and an output data distribution region is divided into four regions in order to facilitate the understanding, the number of divided regions may be eight divisions using three parameters, 16 divisions using four parameters, and the number of divided regions obtained by multiplying 2 by the number of parameters. Alternatively, the output data distribution region may be divided into four regions by selecting two parameters from among a plurality of parameters even when the number of parameters is three or more.

EXAMPLE 2

Example 2 shows an example in which system section data is managed using the results obtained by estimating an output data distribution region in Example 1. According to Example 2, an analyst who analyzes system section data can reduce unnecessary analysis processing by lowering the priority of analysis of input data for which it is estimated that output data similar to the past analysis results is obtained to achieve an improvement in the efficiency of analysis. In general, since the system section data analysis device 202 shown in Example 1 requires much time for analysis, unnecessary analysis processing can be reduced by omitting the analysis of input data which can be estimated from output data. Further, in Example 2, the same reference numerals and signs are attached to the same components as those in Example 1, and the description thereof will not be repeated.

Further, pieces of input data are collectively managed and visualized for each output data distribution region to be estimated, and thus it is possible to estimate the number of high-priority pieces of input data to be analyzed and to predict an analysis work time from the number of high-priority pieces of input data.

Figure 12:
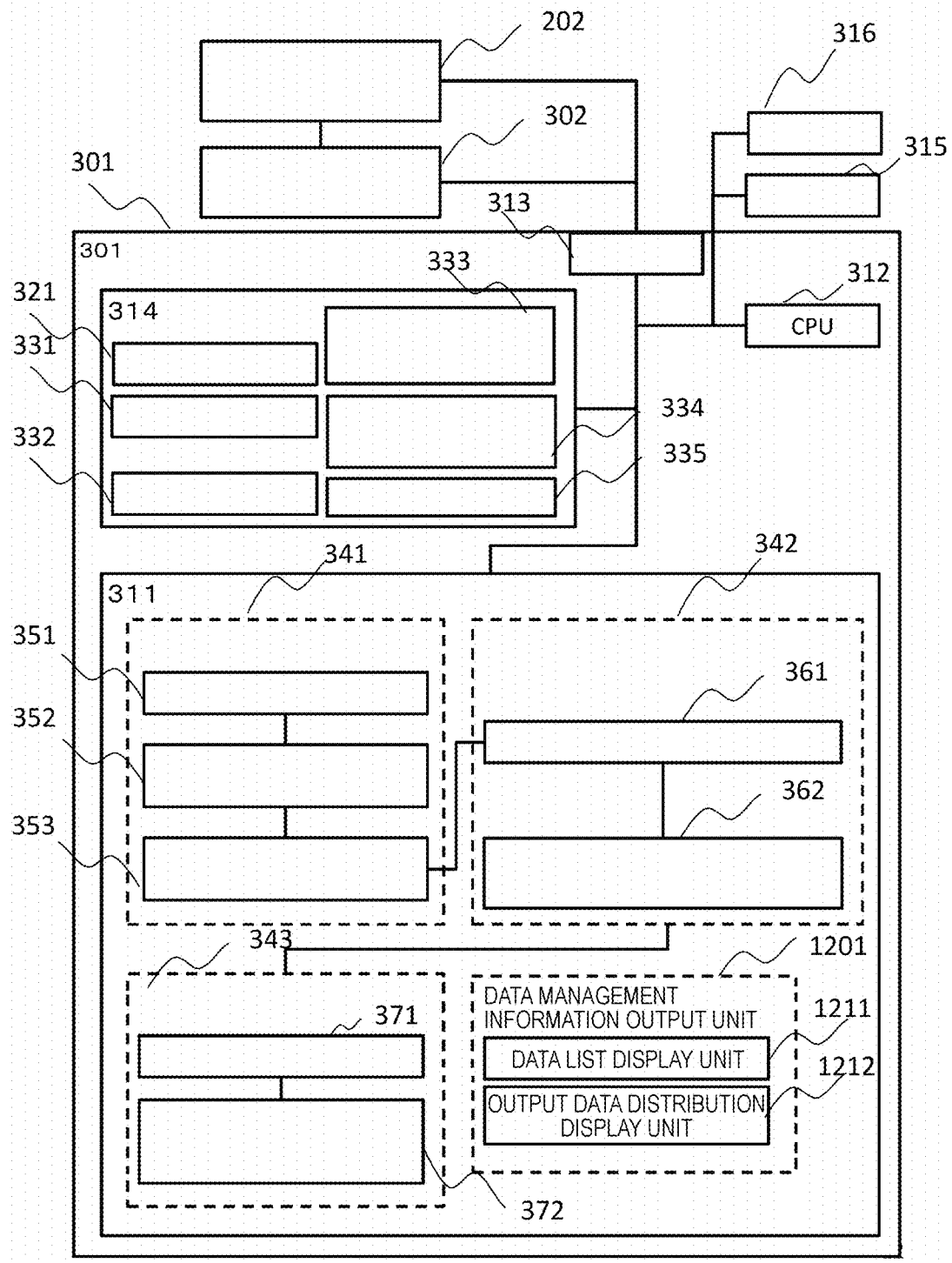
FIG. 12 is a diagram illustrating an example of the system section data management device that outputs data management information.

FIG. 12 illustrates an example of a system section data management device that outputs data management information in Example 2. The system section data management device that outputs the data management information is a device obtained by adding a data management information output unit 1201 to the system section data management device 301 in order to output a system section data management screen illustrated in FIG. 13. The data management information output unit 1201 includes a data list display unit 1211 that displays an input data list to be managed on a screen and an output data distribution display unit 1212 that displays a distribution of output data of results obtained by analyzing input data.

Figure 13:
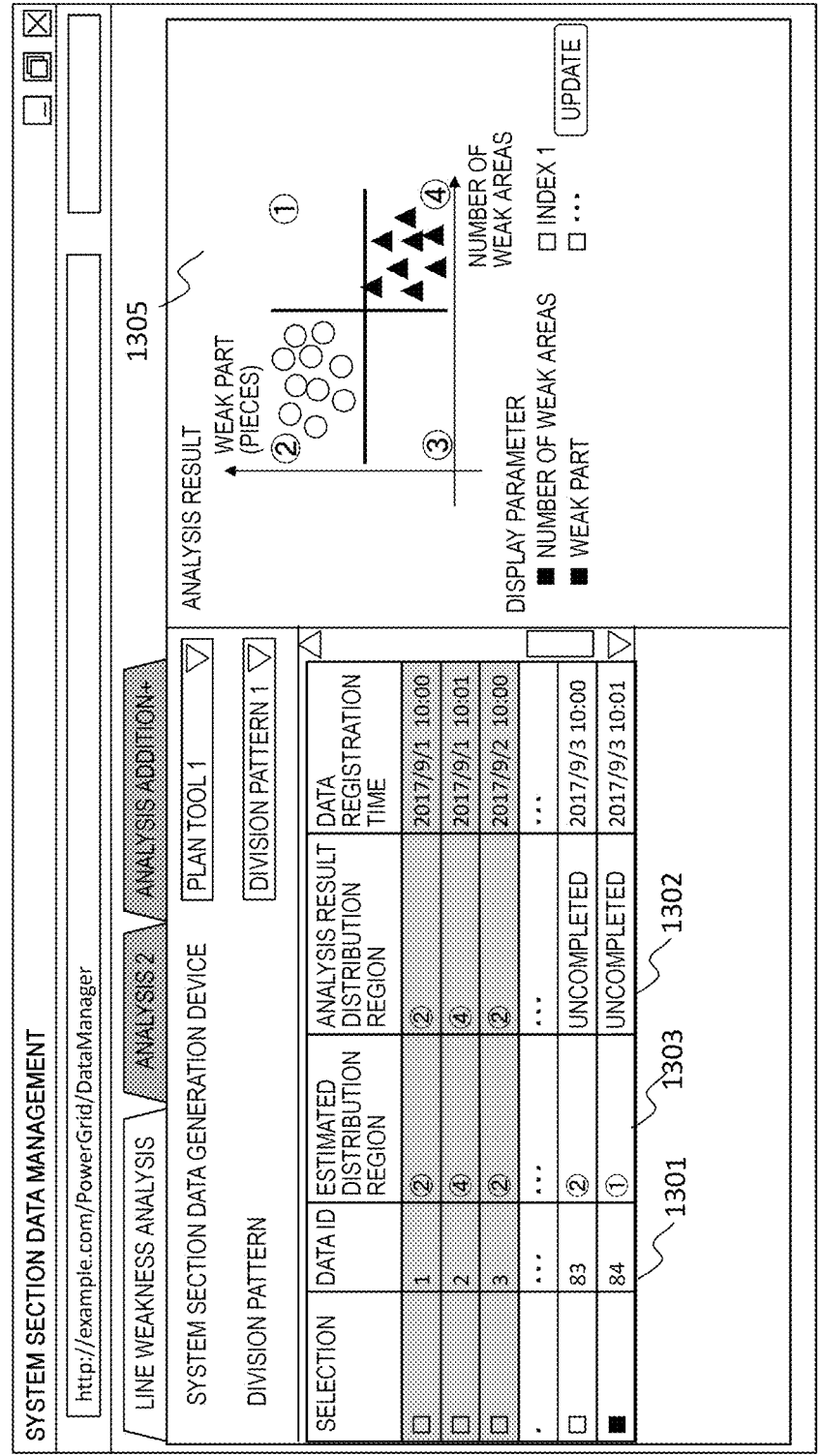
FIG. 13 is a diagram illustrating an example of a system section data management screen.

Hereinafter, an example in which input data for which it is estimated that output data different from the past analysis results is obtained is selected as an object to be analyzed will be described with reference to an example of the system section data management screen of FIG. 13.

The output data distribution display unit 1212 plots the output data on the analysis results represented by the scatter diagram 1305 in the system section data management screen with reference to the output data management table 601. Thereafter, region division for dividing a region of the analysis results is performed.

In the region division, values of a division condition Xr and a division condition Yr are acquired with reference to the output data distribution region management table 1001. By using these acquired values, results obtained by dividing a distribution of output data are displayed on a screen 1305 of the analysis results. For example, in a case where division is performed using two values of Xr and Yr, the region is divided into four regions, and the respective regions are indicated by circled numbers in FIG. 13 in which numbers (1) to (4) are displayed as region IDs uniquely indicating the respective regions.

The data list display unit 1211 acquires a list of an input data ID, an output data belonging group ID, and an output data estimation belonging group ID from the input data management table 501. Thereafter, the input data ID is displayed in a data ID 1301 of the system section data management screen. Regarding the output group ID and the output data estimation belonging group ID, a region corresponding to each ID is specified from four regions after division which are displayed in the scatter diagram 1305, and the numbers of the respective region IDs (1) to (4) are displayed in an analysis result distribution region 1302 and an estimated distribution region 1303.

In this case, when an output data belonging group ID is not present before data analysis, "uncompleted" is displayed to indicate that it is before analysis. For data which has been analyzed, a background color of a row may be changed.

According to such display, for example, an analyst who analyzing system section data can confirm a data list table and analysis results to specify input data for which there is a possibility that output data may be distributed in a region different from that in the past analysis, before analysis.

Data of the data list table is made selectable in the system section data management screen. When the data is selected, parameters may be acquired from the input data management table 1001 and may be displayed and drawn on the system section data. In addition, input data specified by a data ID to be analyzed may be immediately analyzed and preferentially analyzed by writing the data ID and pressing down an analysis execution button. In this case, a predicted analysis time maybe displayed from the time taken for analysis in the past.

EXAMPLE 3

Example 3 shows an example in which parameter candidates of system section data are output using the results obtained by dividing an output data distribution region in Example 1. According to Example 3, an analyst who analyzes system section data or a planner who generates system section data obtains input data for obtaining desired output data, that is, information of parameter candidates of the system section data. Based on the information of the parameter candidates, the analyst or the planner can reduce the number of repetitions of generation and analysis of the system section data which are work for trials and errors performed until the desired output data is obtained, can reduce a work time for the analysis and planning of the system section data, and can improve efficiency. Further, in Example 3, the same reference numerals and signs are attached to the same components as those in Example 1, and the description thereof will not be repeated.

Figure 14:
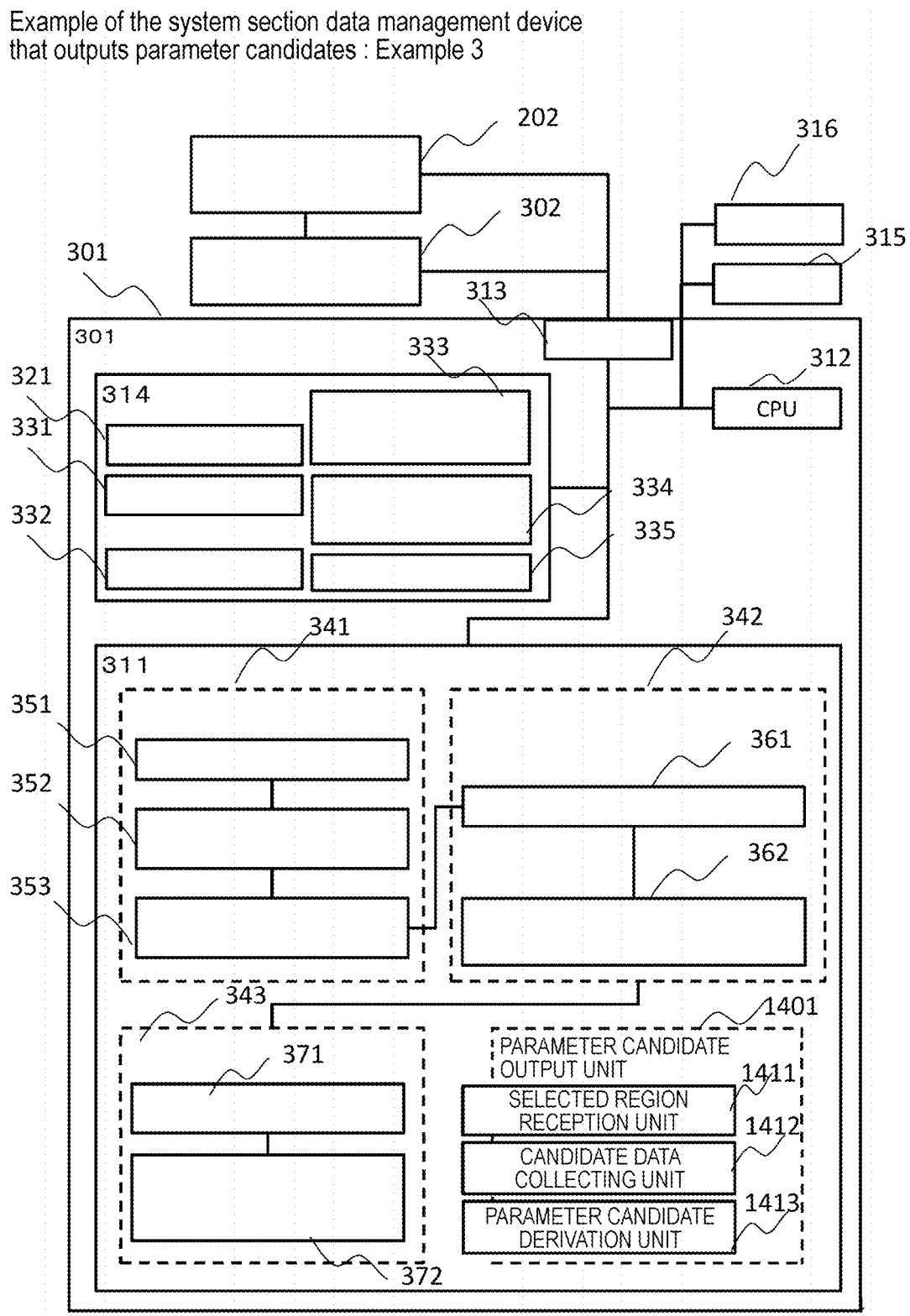
FIG. 14 is a diagram illustrating an example of the system section data management device that outputs parameter candidates.

FIG. 14 illustrates an example of a system section data management device that outputs parameter candidates in Example 3. The system section data management device outputting the parameter candidates is a device obtained by adding a parameter candidate output unit 1401 to the system section data management device 301 of Example 1 in order to output a parameter candidate presentation screen illustrated in FIG. 15. The parameter candidate output unit 1401 includes a selected region reception unit 1411 that receives a region of output data desired by an analyst or a planner as selected region, a candidate data collecting unit 1412 that collects input data regarding the selected region, and a parameter candidate derivation unit 1413 that derives a parameter candidate of input data for which output data belongs to the selected region from the collected input data.

Figure 15:
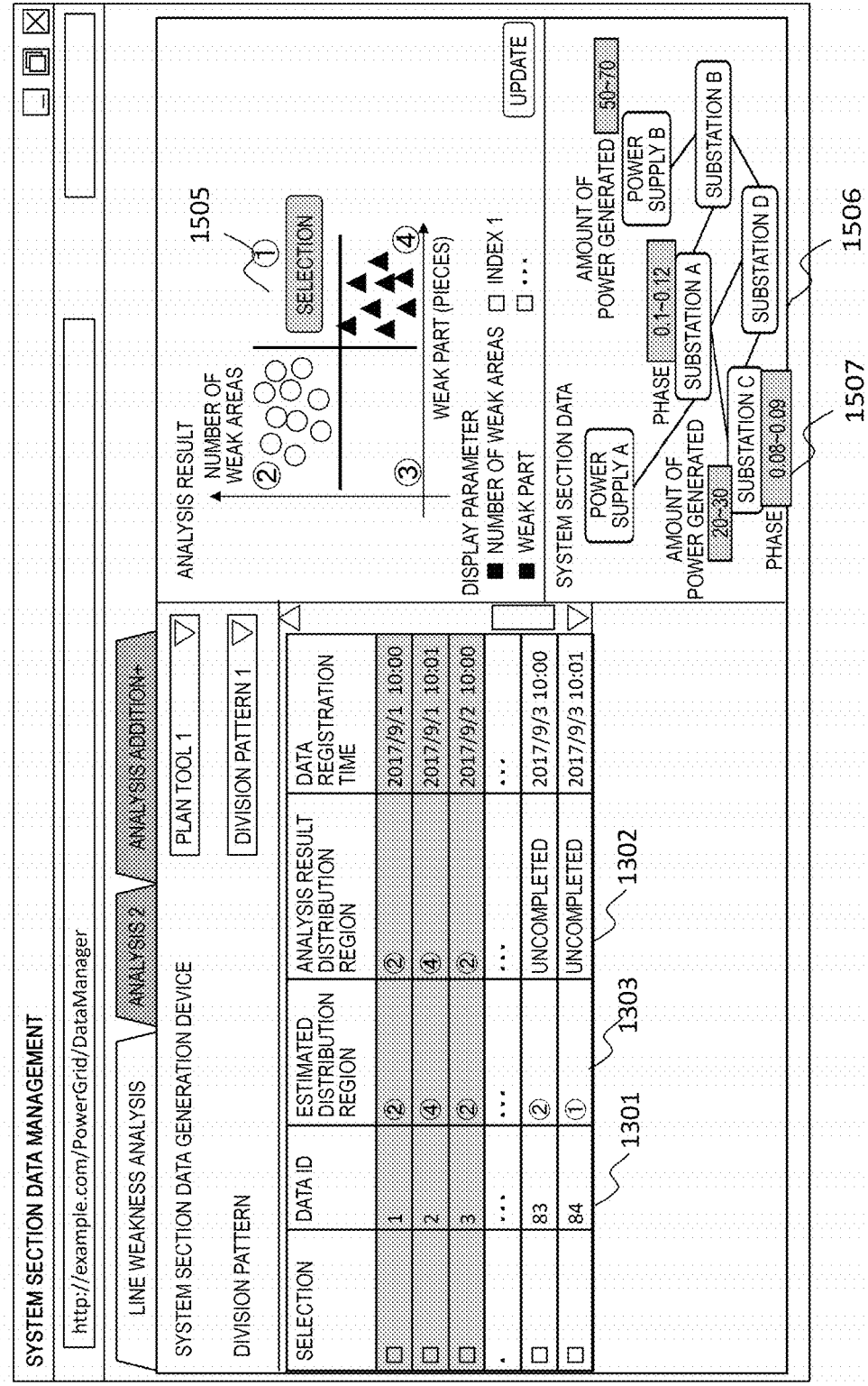
FIG. 15 is a diagram illustrating an example of a parameter candidate presentation screen.

Hereinafter, an example in which an analyst or a planner acquires a parameter candidate of system section data will be described with reference to an example of the parameter candidate presentation screen of FIG. 15. First, the selected region reception unit 1411 receives region information on analysis results selected by the analyst or the planner as a selected region. This selected region may be set to be, for example, a region divided into regions (1) to (4), or may be selected by the analyst or the planner in a form 1505 surrounding a desired region using a drawing tool or the like from a region where the analysis results are displayed, for example, as illustrated in FIG. 15. Subsequently, the candidate data collecting unit retrieves related input data from the input data management table 501 using information on the selected region and collects the input data. In this retrieval method, for example, parameter candidates in a case where the selected region includes data having a weak part of 13 to 17 and the number of weak areas of 4 to 6 as the range of the selected region are derived. Thereafter, output data having a weak part of 13 to 17 and output data having the number of weak areas of 4 to 6 are collected from the output data management table 601. A related input data aggregate is collected from the output data aggregate obtained here through an input data ID managed using the output data management table.

A parameter candidate derivation unit 1513 extracts an input parameter managed using the input data management table 501 with respect to the collected input data aggregate and displays the extracted input parameter as a parameter 1507 of system section data on a parameter candidate presentation screen 1506 illustrated in FIG. 15. Regarding values displayed here, input parameter candidates may be arranged, or a maximum value and a minimum value of the parameter candidates may be displayed. In addition, the parameter candidates may be displayed separately using a region in which output data is distributed. For example, display may be performed by changing colors so as to know a difference between a parameter in a case where a weak part is 13 to 17 and a parameter in a case where the number of weak areas is 4 to 6.

Meanwhile, the present technology is not limited to the above-described Examples and includes various modification examples. For example, the above-described Examples are described in detail for easy understanding of the present technology and are not necessarily limited to those including all of the configurations described above. Further, a portion of a configuration of a certain Example can be substituted with a configuration of another Example, a configuration of another Example can also be added to a configuration of a certain Example. Addition, deletion, and substitution of another configuration can be performed on a portion of a configuration of each Example. In addition, with regard to the above-described configurations, functions, processing units, processing methods, and the like, a portion or the entirety thereof may be realized by hardware, for example, by being designed as an integrated circuit. Further, the above-described configurations, functions, and the like may be realized with software by a processor interpreting and executing a program for realizing each of the functions. Information such as programs, tables, and files for realizing the functions can be placed in a recording device such as a memory, a hard disk, or a solid state drive (SSD) or a recording medium such as an IC card, an SD card, or DVD.

What is claimed is:

1. A system section data management device system comprising:
    a power system including a plurality of power supply facilities, a plurality of substations and a plurality of transmission lines connecting the power supply facilities and the substations,
    a memory coupled to a processor, the processor coupled to the power system and the memory storing instructions that when executed by the processor configure the processor to:
    measure and store first input data of the power system having a plurality of first input parameters, the plurality of first input parameters including an amount of power generated and a phase of the power generated for each of the plurality of power supply facilities of the power system and a phase of each power transmission line connecting each of the plurality of substations to the power supplies of the power system,
    store output data having a plurality of output parameters by analyzing the first input data, and a plurality of associations between the first input data and the output data, wherein the associations between the first input data and the output data are non-linear;
    calculate a division condition based on the output data, the division condition specifying a first division value on a first axis of two axes and a second division value on a second axis of the two axes which divides a distribution of the output data on a plot with the two axes corresponding to at least two parameters among the plurality of output parameters into a plurality of regions, a first axis of the two axes corresponding to one of the at least two parameters indicates weak parts of a power system indicated by the first input data and a second axis of the two axes corresponding to one of the at least two parameters indicates weak areas of the power system,
    derive the output data of the divided output data distribution by setting input data aggregates, corresponding to output data equal to or greater than or equal to or less than the first division value of the first axis and the second division value of the second axes, to be first and second input data groups, setting a first rule belonging to the first input data group to be a first output data distribution rule, and setting a second rule belonging to the second input data group to be a second output data distribution rule, and
    estimate an output data distribution region of second input data, which is different than the first input data and has a plurality of second parameters, which are different than the plurality of first parameters, calculating a first output data distribution region candidate obtained by applying the first output data distribution rule to the second input data and a second output data distribution region candidate obtained by applying the second output data distribution rule thereto, and combining the first output data distribution region candidate and the second output data distribution region candidate with each other.

2. The system section data management system according to claim 1, wherein the processor is configured to:
    store the first input data in association with an input data ID for each piece of first input data, and
    set analysis results of data for the first input data to be output data and store the output data in association with a plurality of parameters included in the output data by attaching an output data ID for each piece of output data,
    wherein the output data is stored in association with a corresponding input data ID.

3. The system section data management system according to claim 1, wherein the processor is configured to:
    read out a plurality of pieces of output, and extract a division condition (Xrn, Yrn) for dividing the plurality of pieces of output data so that an output data distribution in which at least two parameters among the plurality of output parameters are respectively plotted for the X-axis and the Y-axis has either a first division pattern including a first region and a third region or a second division pattern including a second region and a fourth region, in a case where a region satisfying X>Xrn and Y>Yrn is set to be the first region, a region satisfying X<Xrn and Y>Yrn is set to be the second region, a region satisfying X<Xrn and Y<Yrn is set to be the third region, and a region satisfying X>Xrn and Y<Yrn is set to be the fourth region.

4. The system section data management system according to claim 3, wherein the processor is configured to:
    set an input data aggregate corresponding to an output data aggregate, which is present in a specific region among the first to fourth regions, to be an input data group to derive a rule for determining whether or not the second input data belongs to the input data group.

5. The system section data management system according to claim 1, further comprising:
    a display coupled to the processor;
    wherein the processor is configured to display a state where the plurality of pieces of output data are divided according to the division condition together with the two axes.

6. The system section data management system according to claim 5, wherein the processor is configured to display on the display device the estimated distribution region.

7. The system section data management system according to claim 6, wherein the processor is configured to display a specific region in a case where an output data distribution is associated with input data, and performs display for indicating that it is before analysis in a case where an output data distribution is not associated with input data.

8. A system section data management method of a system section data management system which includes a power system including a plurality of power supply facilities, a plurality of substations and a plurality of transmission lines connecting the power supply facilities and the substations, the method comprising:
    measuring and storing first input data of the power system having a plurality of first input parameters as first input data, the plurality of first input parameters including an amount of power generated and a phase of the power generated for each of the plurality of power supply facilities of the power system and a phase of each power transmission line connecting each of the plurality of substations to the power supplies of the power system;

analyzing the first input data to output data having a plurality of output parameters;

storing the first input data and the output data in association with each other, wherein the associations between the first input data and the output data are non-linear;

calculating a division condition based on the output data, the division condition specifying a first division value on a first axis of two axes and a second division value on a second axis of the two axes, which divides a distribution of the output data on a plot with the two axes corresponding to at least two parameters among the plurality of output parameters into a plurality of regions, a first axis of the two axes corresponding to one of the at least two parameters indicates weak parts of a power system indicated by the first input data and a second axis of the two axes corresponding to one of the at least two parameters indicates weak areas of the power system;

deriving the output data of the divided output data distribution by setting input data aggregates, corresponding to output data equal to or greater than or equal to or less than the first division value of the first axis and the second division value of the second axes to be first and second input data groups, setting a first rule belonging to the first input data group to be a first output data distribution rule, and setting a second rule belonging to the second input data group to be a second output data distribution rule;

estimating an output data distribution region of second input data, which is different than the first input data and has a plurality of second parameters, which are different than the plurality of first parameters, calculating a first output data distribution region candidate obtained by applying the first output data distribution rule to the second input data and a second output data distribution region candidate obtained by applying the second output data distribution rule thereto; and combining the first output data distribution region candidate and the second output data distribution region candidate with each other to estimate an output data distribution region of the new input data.

9. The system section data management method of the system section data management system according to claim 8, wherein the estimated distribution region is displayed.

10. The system section data management method of the system section data management system according to claim 9, wherein the displayed output data distribution region is selected, and parameters of input data corresponding to the selected output data are displayed as parameter candidates of the output data.

* * * * *